United States Patent [19]
Lee et al.

[11] Patent Number: 5,217,120
[45] Date of Patent: Jun. 8, 1993

[54] APPARATUS FOR LOADING AND UNLOADING SLEEVES FOR INTEGRATED CIRCUIT ESTER

[75] Inventors: Soo P. Lee, Kumi; Kim I. Sub, Taegu; Duk H. Lee, Kumi; Yol Kim, Daejon; Dong C. Ahn, Taegu, all of Rep. of Korea

[73] Assignee: Goldstar Co., Ltd., Seoul, Rep. of Korea

[21] Appl. No.: 866,275

[22] Filed: Apr. 13, 1992

Related U.S. Application Data

[63] Continuation of Ser. No. 573,774, Aug. 28, 1990, abandoned.

[30] Foreign Application Priority Data

| | | |
|---|---|---|
| Aug. 31, 1989 [KR] | Rep. of Korea | 12565/1989 |
| Oct. 25, 1989 [KR] | Rep. of Korea | 15372/1989 |
| Oct. 25, 1989 [KR] | Rep. of Korea | 15506/1989 |
| Nov. 18, 1989 [KR] | Rep. of Korea | 17068/1989 |
| Nov. 18, 1989 [KR] | Rep. of Korea | 17069/1989 |
| Mar. 31, 1990 [KR] | Rep. of Korea | 3834/1990 |

[51] Int. Cl.$^5$ .............................................. B07C 5/344
[52] U.S. Cl. ................................... 209/573; 209/571; 209/909; 209/936; 324/158 F; 414/404; 414/415
[58] Field of Search ............... 209/552, 571, 573, 909, 209/914, 916, 936; 198/397; 414/224, 403, 404, 415; 221/200, 204; 324/73.1, 158 F

[56] References Cited

U.S. PATENT DOCUMENTS

| | | | |
|---|---|---|---|
| 4,457,451 | 7/1984 | Ichikawa | 221/200 X |
| 4,660,710 | 4/1987 | Swapp et al. | 414/403 X |
| 4,690,302 | 9/1987 | Zebley et al. | 221/200 X |
| 4,722,659 | 2/1988 | Hoyt, III et al. | 414/403 x |
| 4,761,106 | 8/1988 | Brown et al. | 414/403 X |
| 4,763,811 | 8/1988 | Mae et al. | 414/403 X |
| 5,038,914 | 8/1991 | Cotic et al. | 198/397 X |

OTHER PUBLICATIONS

Undated Brochure on Toshiba F1-1000 IC Stick Handling and Inspection Device.
MCT Preliminary Sales Specifications for an IC Tester Device dated Aug. 30, 1988.

*Primary Examiner*—Andres Kashinkow
*Assistant Examiner*—J. A. Kaufman
*Attorney, Agent, or Firm*—Fish & Richardson

[57] ABSTRACT

An apparatus for automatically loading and unloading sleeves for an IC tester and then selectively reloading the sleeves after testing, which is controlled by a conventional microprocessor using sensor input and which automatically transports the IC chip containing sleeves randomly contained in a hopper to a sorter section in a correct posture by means of a timing belt having sleeve holders, to feed the chips in the sorter section, to the tester by a first transfer block, and then automatically transfer empty sleeves from an ejector section having a cam plate and an ejector through a dropping section having a pair of guide rails to an unloader section having a second transfer block, a sleeve holder, a sensor and a pushing plate, thereby permitting the sleeves to be refilled with the tester and sorted IC chips and stored in a storage box.

17 Claims, 14 Drawing Sheets

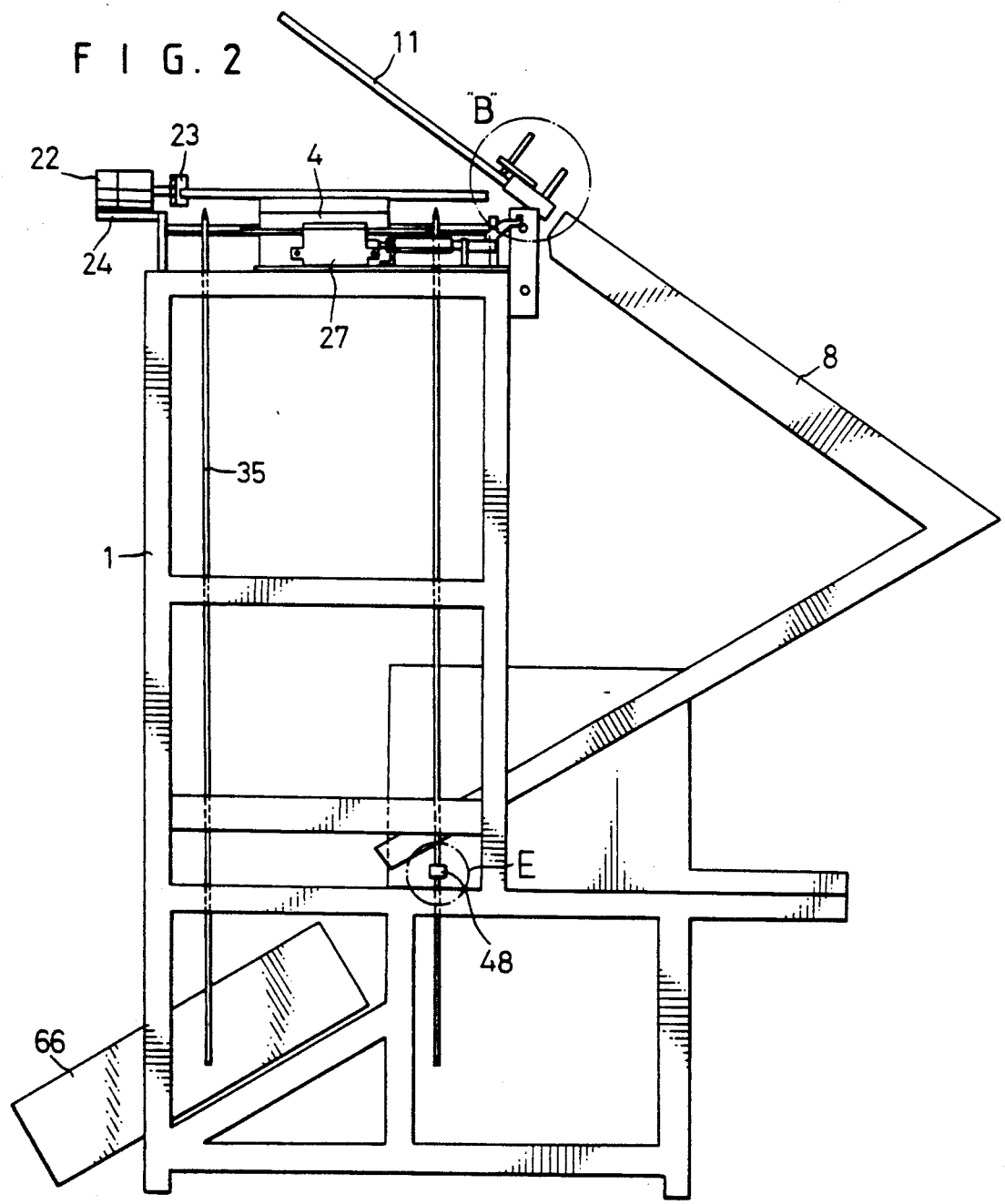

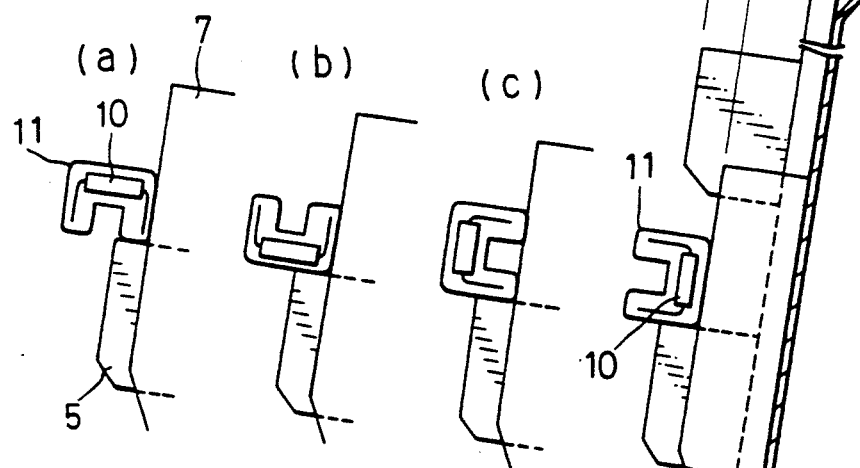
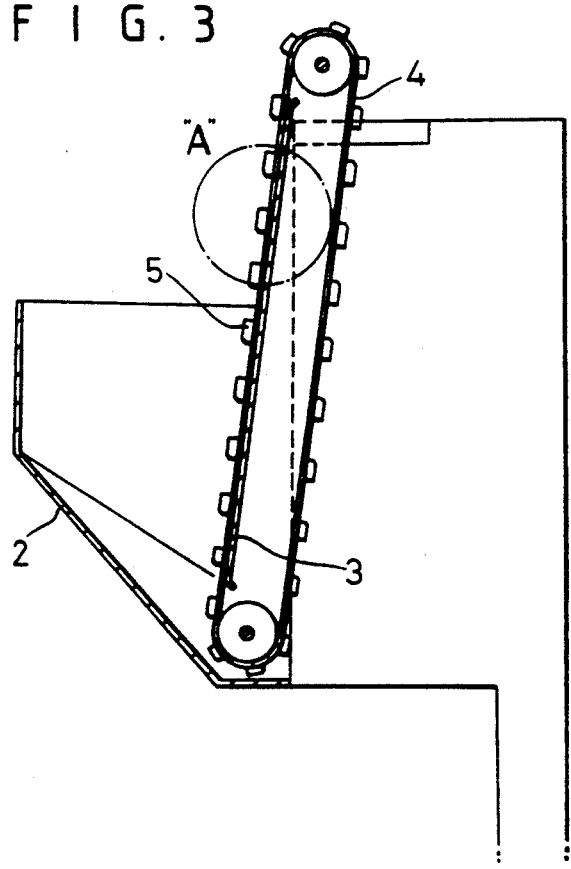
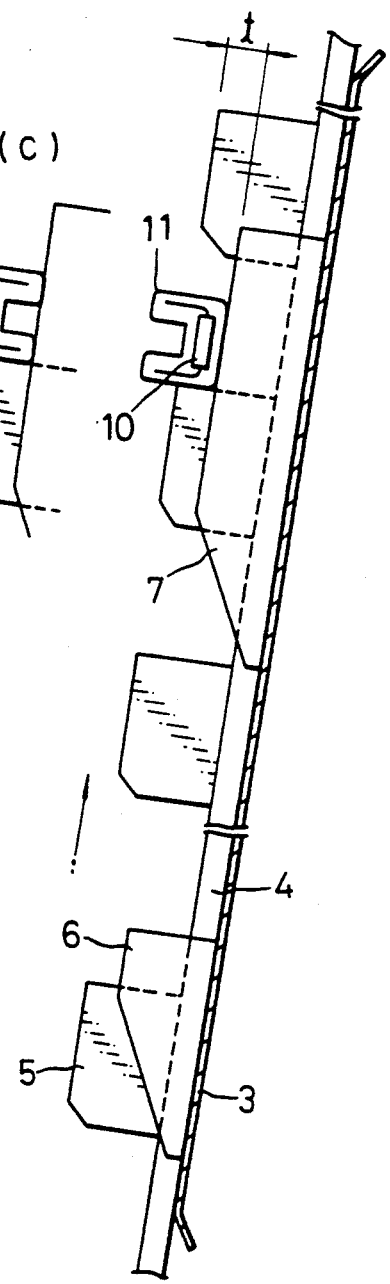
FIG. 4
FIG. 3

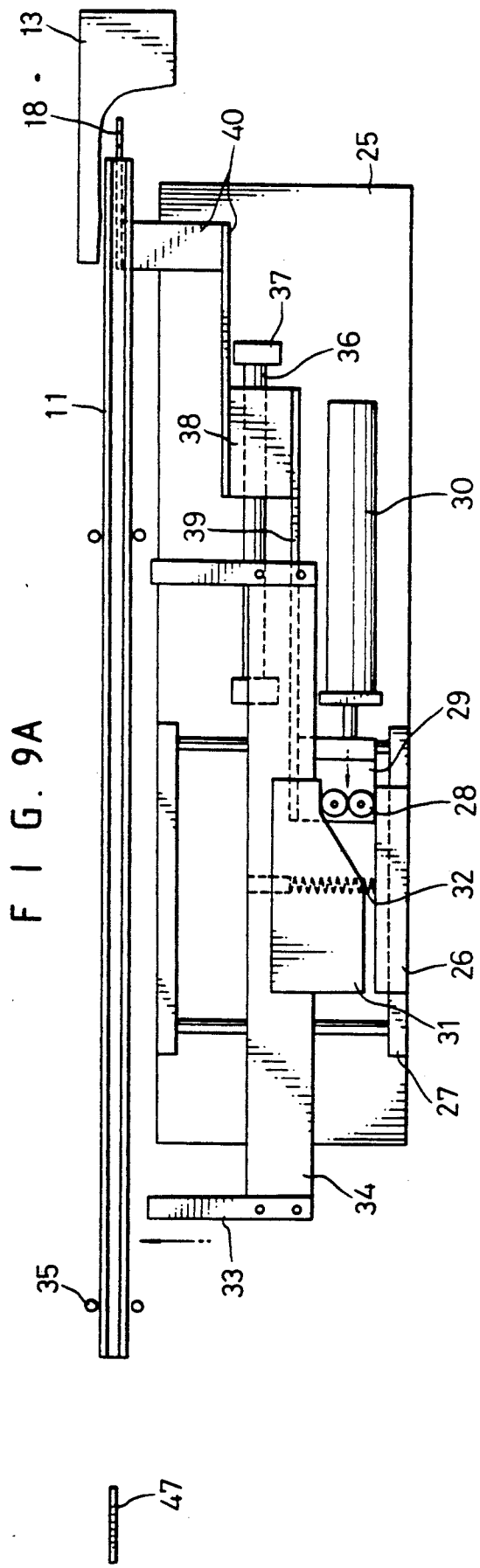

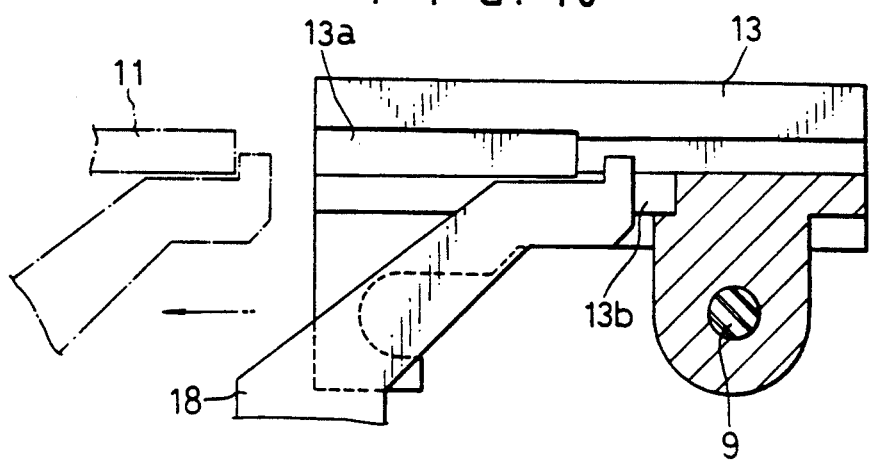
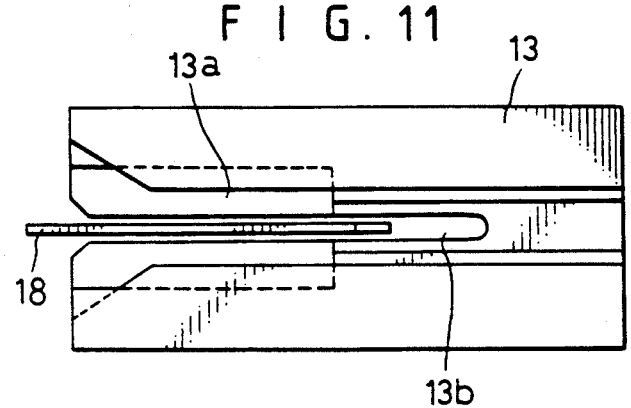
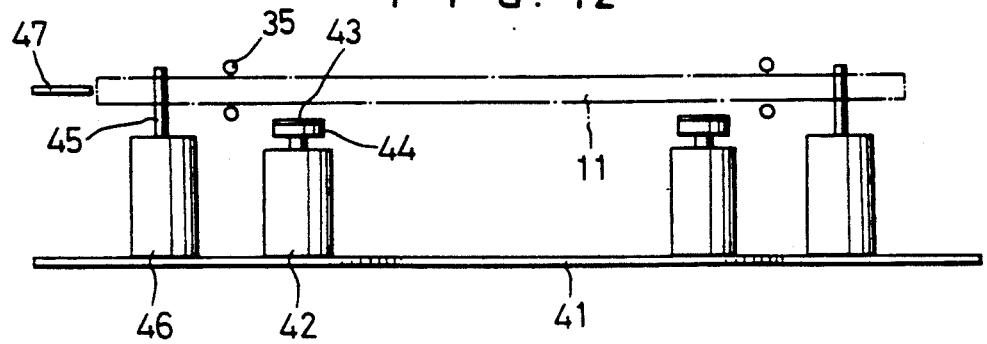

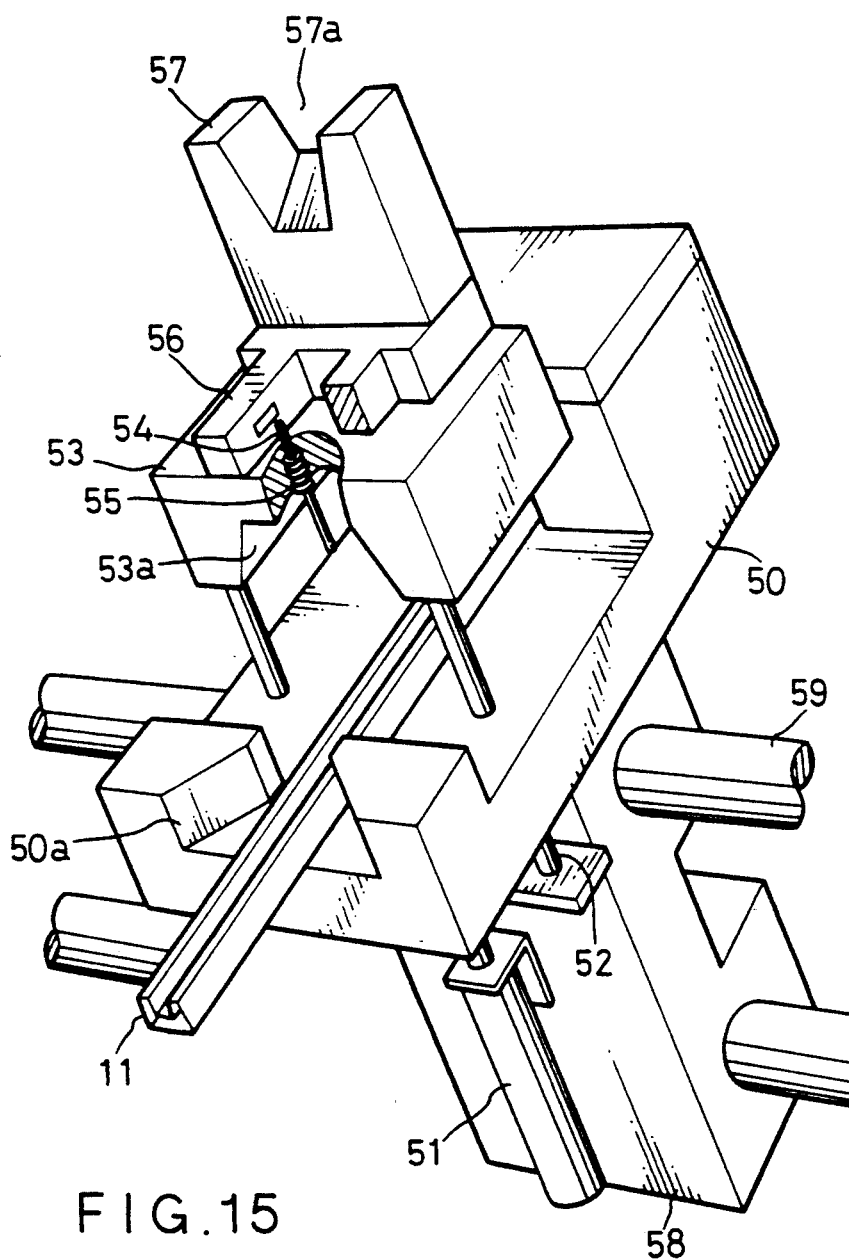
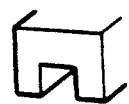
FIG.15a
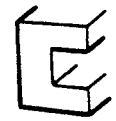
FIG.15b
FIG.15c
FIG.15

APPARATUS FOR LOADING AND UNLOADING SLEEVES FOR INTEGRATED CIRCUIT ESTER

This application is a continuation of U.S. application Ser. No. 07/573,774, field Aug. 28, 1990, now abandoned.

BACKGROUND OF THE INVENTION

1. Field of the invention

The present invention relates to an apparatus for loading and unloading sleeves for an Integrated Circuit, or IC, tester wherein electronic components such as IC chips contained in the sleeves are automatically and continuously fed from a supply source to the tester, sorted according to characteristics of the tested chips, and thereafter contained again in empty sleeves.

2. Description of the Prior Art

In a prior apparatus for loading and unloading sleeves for an IC tester, the sleeves containing IC chips are manually placed by an operator sequentially and with proper orientation into a pair of loaders each having a hollow channel or "U" shaped cross section. Then the sleeves are transported one by one to the tester to feed the IC chips in the transported sleeve into the tester. The now empty sleeves are randomly collected into a storage box. Thereafter, these empty sleeves are gathered by an operator, fed manually to an unloader, and the IC chips which have passed through the tester and been sorted according to the characteristics of the chips are inserted into the empty sleeves. In this case, the sleeves must be constantly and orderly fed to the loader and unloader manually by the operator. Therefore, in such a prior apparatus, the process is less efficient because feeding the sleeves to the loader is carried out by hand. In addition, because the empty sleeves must be transported by the operator from the loader to the unloader, rather than be automatically transported, productivity is low.

SUMMARY OF THE INVENTION

In view of the problem of the conventional apparatus described above, it is an object of the present invention to provide an apparatus for automatically loading and unloading sleeves for an IC tester. This apparatus automatically picks up and conveys, by means of a timing belt, IC chip containing sleeves put randomly into a containing box. This timing belt is located between the interior of the containing box and a sorter section of the apparatus. The apparatus also empties the sleeves into the tester automatically, transfers empty sleeves to an unloader section, refills the sleeves after the IC chips have been tested and sorted according to their characteristics, and stores the sleeves. The apparatus is controlled by conventional sensors and microprocessor means.

To achieve the above object, the present invention provides an apparatus for loading and unloading sleeves for an IC tester. This apparatus is comprised of: a loader section including a timing belt provided between a containing box and a bracket, both fixed to a frame, with sleeve holders equidistantly mounted on said timing belt conveying the sleeves, and with first and second aligning plates secured to a fixed plate; a sorter section including a first transfer block having integral legs formed with hooking grooves, this transfer block having also a gripping recess for gripping the sleeve, transfer bars for guiding a reciprocation of the first transfer block, a carriage movable along the transfer bars, a solenoid valve secured to the first transfer block, a swing arm for elevating and lowering the first transfer block, with a pushing plate for inserting the sleeve into the gripping recess; an ejector section including a roller supporting table having a pair of rollers and mounted on a stationary plate, a cam plate movable by the rollers, supporting bars connected to the cam plate by means of a connecting plate, and an ejector linked to the sliding block via connecting pieces; a dropping section including a pair of guide rails, a pair of first cylinders mounted on a stationary plate and each having a silicon plate and a pushing plate, and another pair of second cylinders disposed outside of the first cylinders and each having an engaging rod; and an unloading section including a second transfer block for gripping and transporting an empty sleeve, a sleeve holder connected to guide bars passing through the second transfer block, a sensor pin disposed in the sleeve holder and normally biased downward by a spring, a sensor for detecting the insertion of the sleeve through the sensor pin, and a pushing plate for inserting the sleeve into the second transfer block; whereby, when the sleeves filled with the IC chips are put into the containing box, the sleeves are fed to the sorter section through the loader section, thereby feeding the IC chips to the tester, and the empty sleeves which arrived at a given position of the sorter section are transferred to the dropping section by means of the ejector section, and then, when the IC chips are sorted by the tester, the empty sleeves receive the tested IC chips and thereafter are classified and stored in storage box at the unloading section.

The various segments of the apparatus are controlled by a conventional microprocessor which receives input from strategically placed sensors, comprising for instance both photoelectric and mechanical sensors, that detect sleeve and chip placements, and which additionally is designed or programmed to coordinate the operation of the various sections of the apparatus.

According to the apparatus of the present invention, the sleeves filled with the IC chips are randomly contained in the containing box with one of the caps at the appropriate end of the respective sleeves removed. The sleeves are then continuously transported by the timing belt and automatically fed to the sorter section in a correct posture, and the IC chips are then fed to the tester. Thus, the loading section is automated. Further, because the empty sleeves are automatically transferred by the first transfer block to the ejector section and then fed one by one from the ejector section through the dropping section to the unloading section to be refilled with the IC chips sorted by the tester, the whole operation is automated, thereby improving efficiency.

Many other advantages, features, and additional objects of the present invention will become manifest to the persons skilled in the art upon making reference to the following detailed description and the accompanying drawings in which a preferred embodiment incorporating the principle of the present invention is shown by way of illustrative example.

BRIEF DESCRIPTION OF THE DRAWINGS

FIG. 2 is a schematic side view of the apparatus;

FIG. 3 is an enlarged fragmentary view, partly in cross section of a portion of the apparatus shown in FIG. 1;

FIG. 4 is an enlarged perspective view of the portion "A" encircled in FIG. 3;

FIG. 6 A is a cross sectional view of a portion of the sorter section shown in FIG. 6;

FIG. 6 B is a schematic elevational view of the top portion of the apparatus;

FIG. 7 A is a top plan view of a portion of the sorter section shown in FIG. 7;

FIG. 7 B is a side elevational view of a portion of the sorter section;

FIG. 9 B is a cross sectional view of the ejector section after it operates;

FIG. 10 is a longitudinal sectional view of the first transfer block with an ejector arranged under the block;

FIG. 11 is a plan view of the first transfer block shown in FIG. 10;

FIG. 12 is a plan view of the dropping section, showing the sleeve supported by an engaging rod;

FIG. 15 is an enlarged perspective view, partly in cross section, of portion "C" shown in FIG. 19; FIG. 15a)–c) show the sleeve in various orientations;

DESCRIPTION OF THE PREFERRED EMBODIMENT

Figure 1:
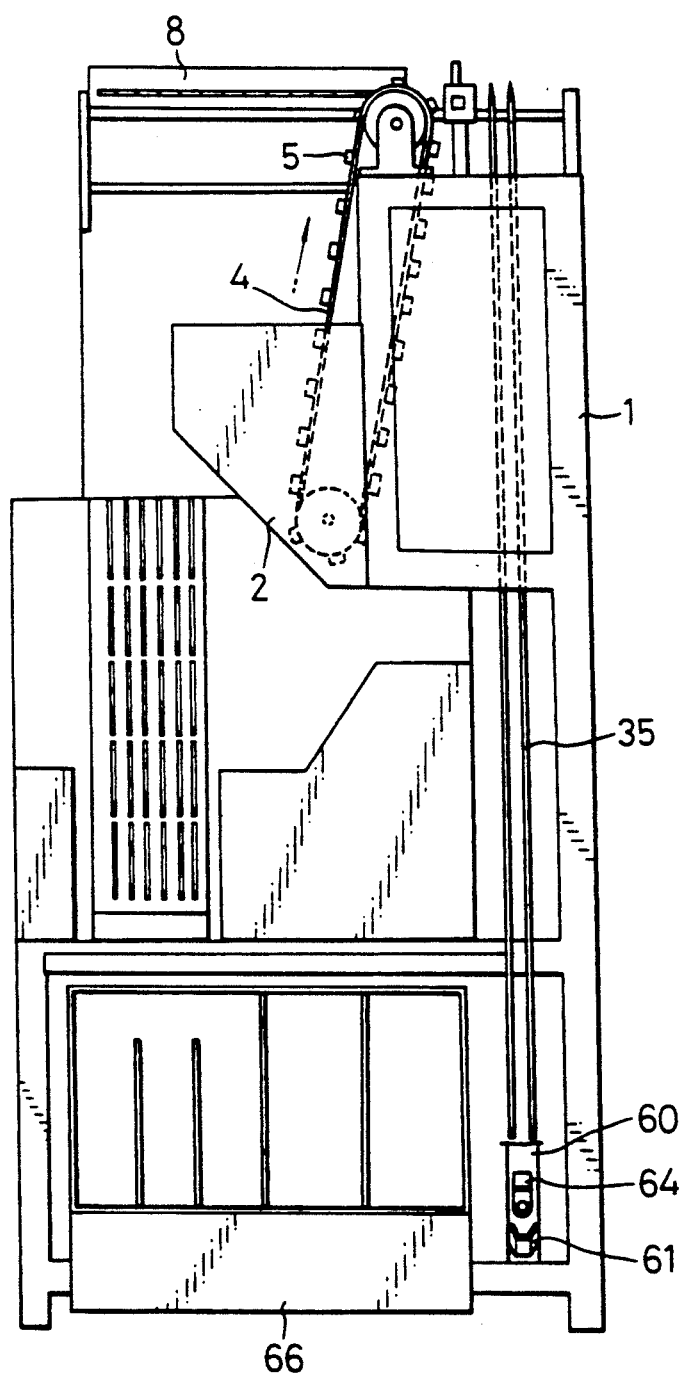
FIG. 1 is a schematic elevational view of an apparatus according to the present invention.
Figure 5:
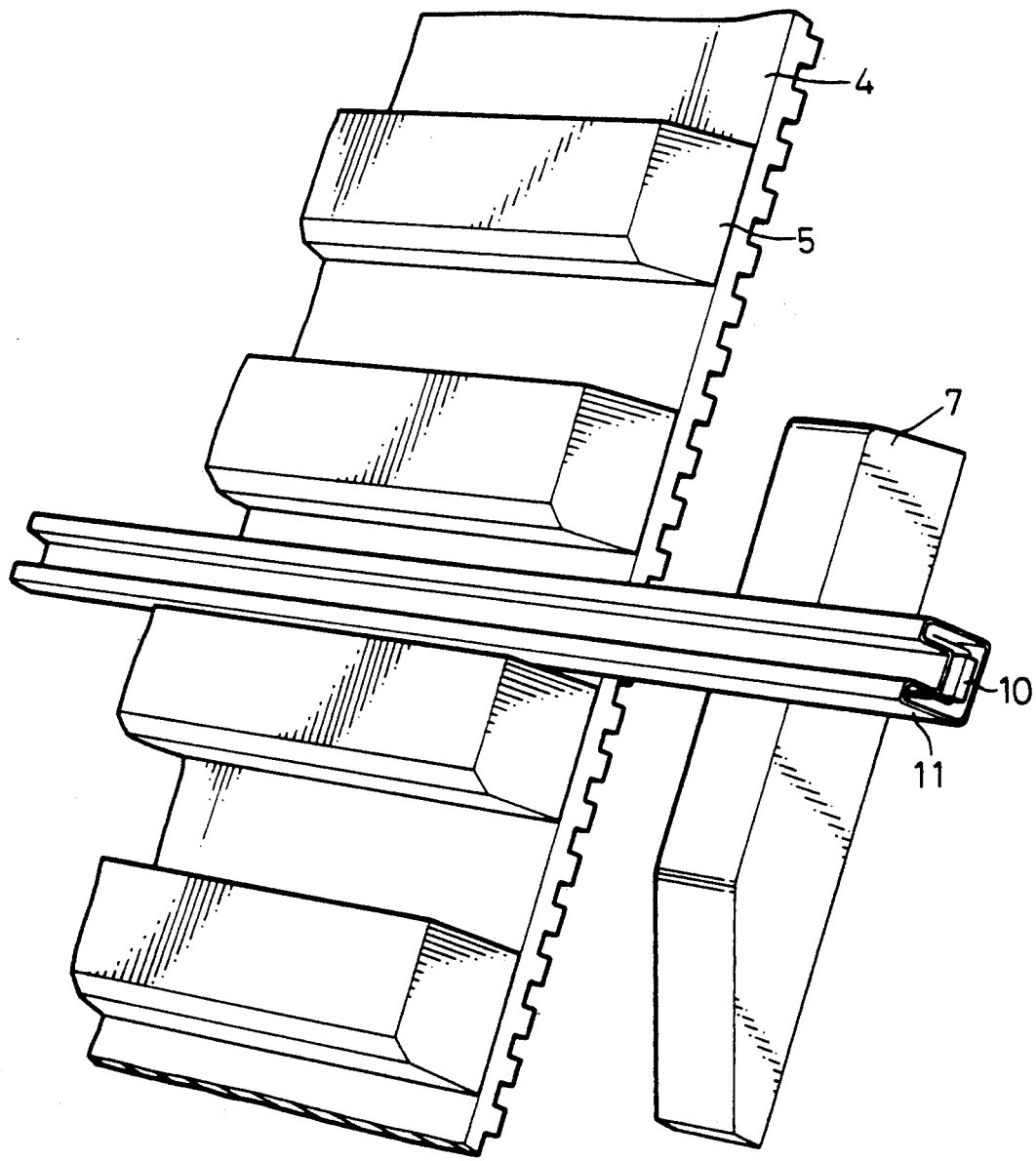
FIG. 5 is a perspective view of the portion shown in FIG. 4.

FIGS. 1 and 2 are schematic illustrations of an embodiment of an apparatus for loading and unloading sleeves for an IC tester according to the present invention. FIGS. 3 to 5 are views showing the loader section of the apparatus, wherein FIG. 3 is a sectional view illustrating a portion of the apparatus shown in FIG. 1. Referring to FIGS. 1 and 3, there is shown a hopper type box (2) for containing sleeves (11) filled with electric components such as IC chips (10). The sleeves are randomly contained in the containing box (2) with the cap at one end of the respective sleeves removed. A timing belt (4) is mounted for rotation at one side of the containing box at a certain angle (for example, about 10 degrees) to a vertical plane to encircle a plate (3) fixed to the frame (1). The timing belt (4) is provided with sleeve holders (5) equidistantly spaced along the length of the belt. The sleeve holders (5) serve to lift up the sleeves (11) in the containing box (2) and feed them to the sorter section as the timing belt rotates by actuation of a main switch (not shown). First and second aligning plates (6,7) each having a lower sloping surface are secured on the opposite side of the timing belt (4) relative to the fixed plate (3) disposed under the timing belt. Therefore, when the sleeves (11) are conveyed to the sorter section by the timing belt (4), they slide on the aligning plates (6,7), as shown in FIG. 4. Specifically, the sleeve, (11) which slides on the aligning plates with its groove faced leftward (as seen from the drawing) may be transported to the sorter section without departing from the sleeve holder (5) by virtue of the location of the center of gravity of the IC chips (10) contained in the sleeve.

When the sleeve is supported on the sleeve holder with the grove faced to the other directions as shown in (a)–(c) of FIG. 4, however, the sleeve is pushed outwardly while passing over the aligning plates, and thus falls into the containing box (2) due to instability of the center of gravity of the sleeve having the IC chips contained therein. The sleeves falling into the containing box (2) may be lifted up again by the sleeve holders (5) and only the correctly positioned sleeves may be transported to the sorter section.

With the timing belt (4) and the fixed plate (3) inclined at an angle of about 10 degrees to the vertical plane, more effective working performance can be achieved. The arrangement of the aligning plates in several pairs is intended to increase the number of sleeves (11) being transported and improve the reliability of aligning the sleeves. A distance (t) between the upper surface of the sleeve holder (5) and the upper surfaces of the first and second aligning plates (6, 7) may be adjusted for most effective operation, for example, by changing the plates according to a size of the sleeve (11) and the shape of the IC chip (10).

Figure 6:
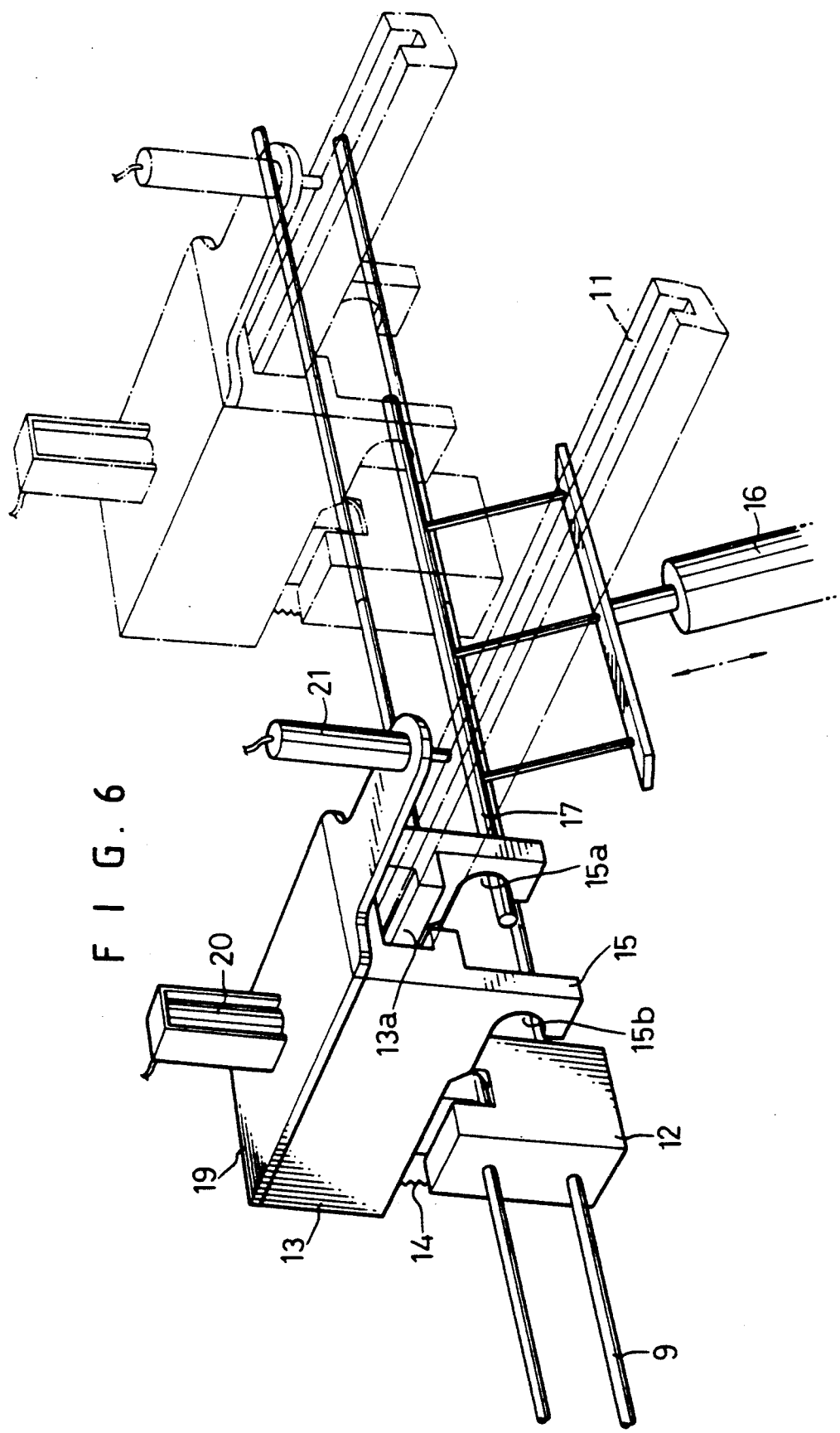
FIG. 6 is an enlarged perspective view of the sorter section of a portion "B" shown in FIG. 2.
Figure 7:
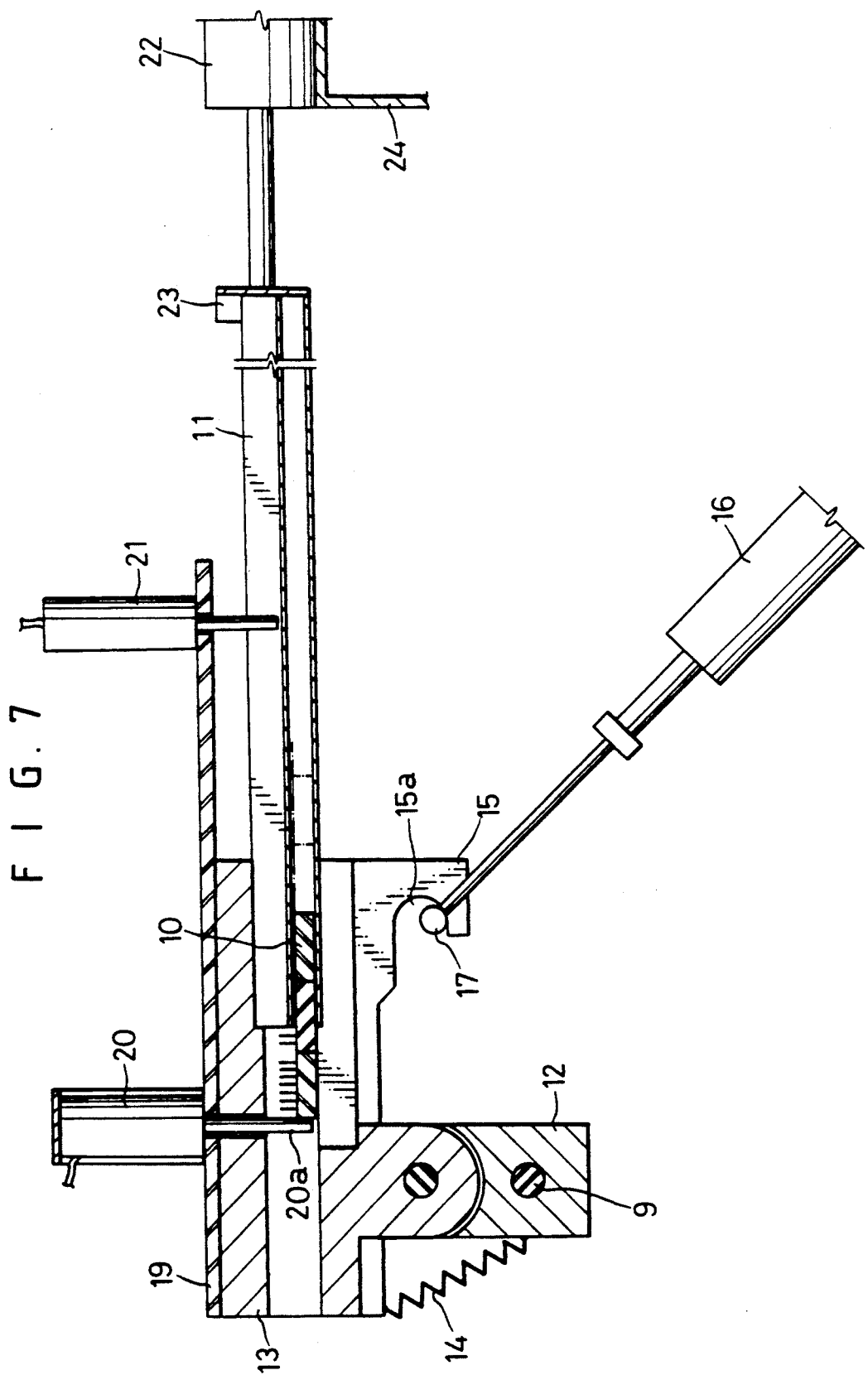
FIG. 7 is a cross sectional view of the sorter section shown in FIG. 6.

In FIGS. 6 through 7, there is shown the sorter section which transfers the sleeves (11) to the IC tester (8) shown in FIGS. 1 and 2 from a loader section, and then sends the empty sleeves to an ejector section A first transfer block (13) is mounted on a top of a carriage (12) which slides horizontally along a pair of transfer bars (9). The transfer block (13) is biased by means of a tension spring (14) to the carriage (12) and may be rotated about the carriage (12) at a certain angle. A pair of legs (15) having hooking grooves (15a, 15b) formed therein are integrally secured to a lower portion of the first transfer block (13).

A swing arm (17) connected to a cylinder (16) for up and down movement may be selectively inserted into the hooking grooves (15a, 15b) formed in the legs (15) as shown in FIGS. 6 and 6A. The pivoting of transfer block (13) is so limited and the overlap of swing arm (17) with the hooking grooves (15a,15b) is such that when the swing arm is extended as shown in FIG. 6A, the swing arm is clear of the transfer block (13) and the transfer block is free to reciprocate, however, at the same time, when solenoid cylinder (16) retracts upon signal by the microprocessor or sensor, the swing arm will engage the hooking grooves (15a,b) and pivot transfer block to a horizontal position. A gripping recess (13a) to grip the sleeve (11) is formed in the transfer block (13). As shown in FIGS. 10 and 11, an elongated aperture (13b) in which an ejector (18) is positioned is also formed at the lower portion of the transfer block (13). The ejector (18) takes out the empty sleeves and feeds them to a dropping section. A cover plate (19) rests on and is secured to the top of the transfer block (13). A solenoid valve (20) with a control pin (20a) at its leading end is mounted on the cover plate (19). In addition, a vibrator (21) is fixed portion extending from one end of the cover plate, assuring a smooth introduction of the IC chip (10) during the feeding of the chips contained in the sleeve (11) into the tester.

As shown in FIG. 2, a pushing plate (23) having a generally V-shaped cross section, actuated by means of a cylinder (22) is mounted through a bracket (24) on the side of a frame (i) opposite the first transfer block. The pushing plate (23) shown in more detail in FIGS. 7A and 7B, inserts the sleeve (11) into the gripping recess (13a) upon actuation of the cylinder (22) when the sleeve is transported to an inlet of the gripping recess (13a) by means of the timing belt (4). In a normal (or initial) condition, the swing arm (17) functioning to swing the transfer block (13) remains elevated or extended. Then, when the sleeve (11) being transported by means of the timing belt (4) in the preceding loader section is positioned in line with the gripping recess (13a) and at the same time the timing belt is stopped by a signal from a sensor (72), the swing arm (17) inserted into one (15a) of the hooking grooves of the legs (15) is lowered or retracted through actuation of the cylinder (16) by a signal from the microprocessor, whereby the first transfer block (13) may be lowered against the pulling force of the spring (14) and then maintained horizontally. In this position, the pushing plate (23) having a generally V-shaped cross section (as shown in FIG. 7A) is moved by the cylinder (22) which is actuated by another signal from the microprocessor, so as to insert the sleeve (11) into the gripping recess (13a). The generally V-shaped cross section of the pushing plate (23) ensures a correct positioning and insertion of the sleeve into the gripping recess. Then, as the swing arm (17) is elevated by means of the cylinder (16), following another signal from the microprocessor or sensor, the transfer block (13) into which the sleeve (11) has been inserted as mentioned above is rotated and inclined by means of the pulling force of the spring (14) at a certain angle. At this point, the IC chips (10) in the sleeve are blocked from movement by means of the control pin (20a) arranged at the end of the solenoid valve (20), as shown in FIG. 7. When the swing arm (17) is removed from the hooking groove (15a) of the legs (15) by a signal from a sensor (not shown), the first transfer block (13) with sleeve (11) contained therein is elevated by spring (14) and pivots, and may be moved along the transfer bars (9) to an empty inlet (deposit slot) of the tester (8), using a timing belt (68) hooked to a stepping motor (69) controlled by a conventional microprocessor and photoelectric or other suitable sensors. Thereafter, the control pin (20a) is elevated by actuation of the solenoid valve (20) by a signal from the microprocessor to open the gripping recess (13a). As a result, the IC chips (10) in the sleeve (11) enter into the tester by their own weight. If the IC chips tightly contact an inner surface of the sleeve, however, the chips may not be entirely fed into the tester. To prevent such incomplete feeding, the vibrator (21) mounted on the extension portion of the cover plate (19) to contact an upper surface of the sleeve (11) is operated under control of the microprocessor after the lapse of an appropriate period of time to vibrate the sleeve after retraction of the control pin (20a). Therefore, all the IC chips in the sleeve may be smoothly fed into the tester (8).

After the IC chips in the sleeve have been fed into the tester, indicated by a signal from the microprocessor after a time lapse or signal from a sensor, the transfer block (13) holding the empty sleeve is moved along the transfer bars (9) by the timing belt (68) and stepping motor (69) in a reverse direction to such a position that the leg (15) having the hooking groove (15b) is positioned on the right side portion of the elevated swing arm (17) as shown in a dash-and-dotted line in FIG. 6. Then, the swing arm (17) is lowered by actuation of the cylinder (16) by a signal from the microprocessor or photoelectric or other sensor which determines the sleeve (11) carried within the transfer block (13), is in position above the guide posts (35), which returns the transfer block (13) to its original horizontal position. Now, the transfer block (13) is located at the ejector section.

Figure 8:
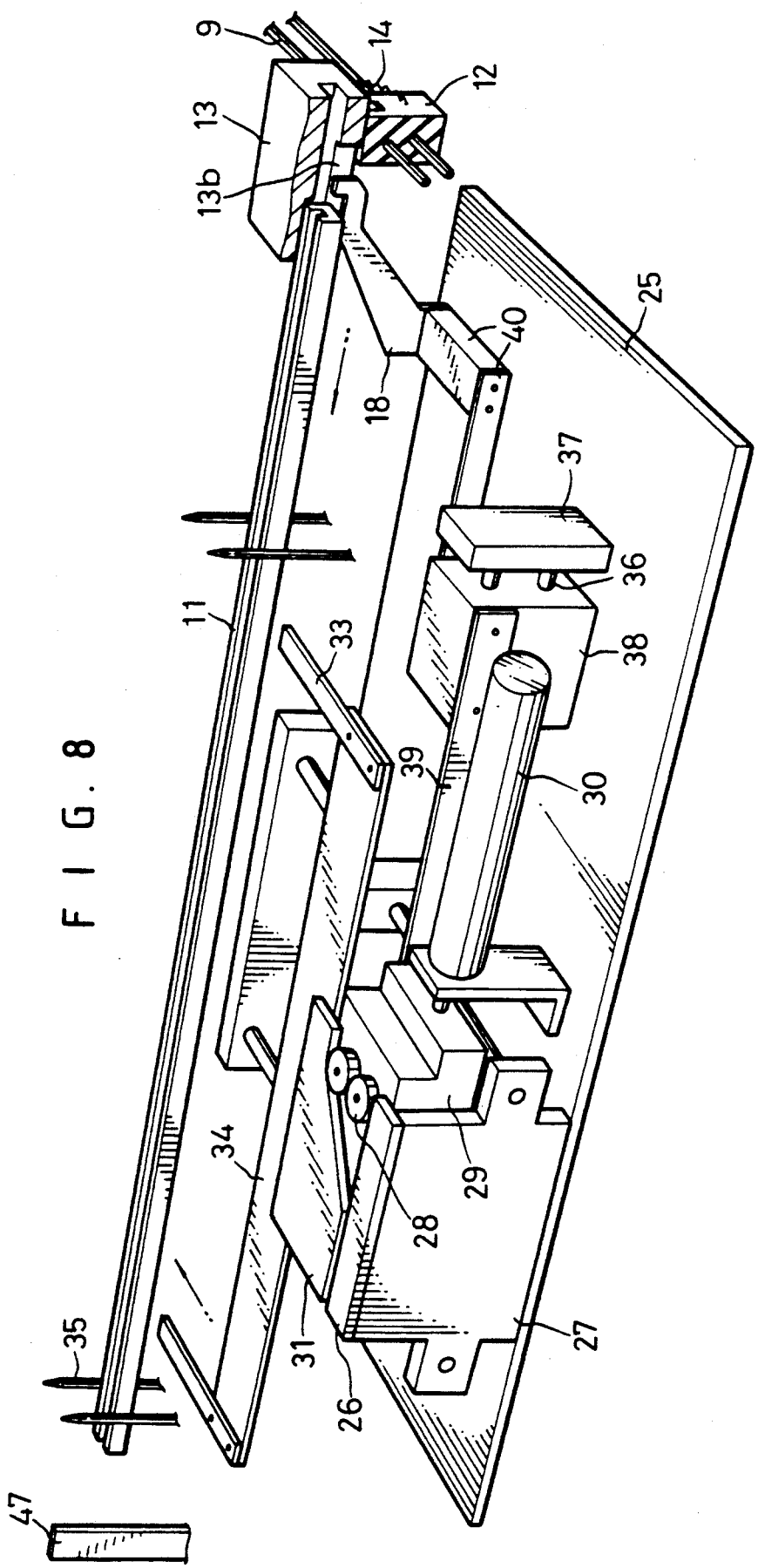
FIG. 8 is a perspective view of the ejector section.
Figure 9B:
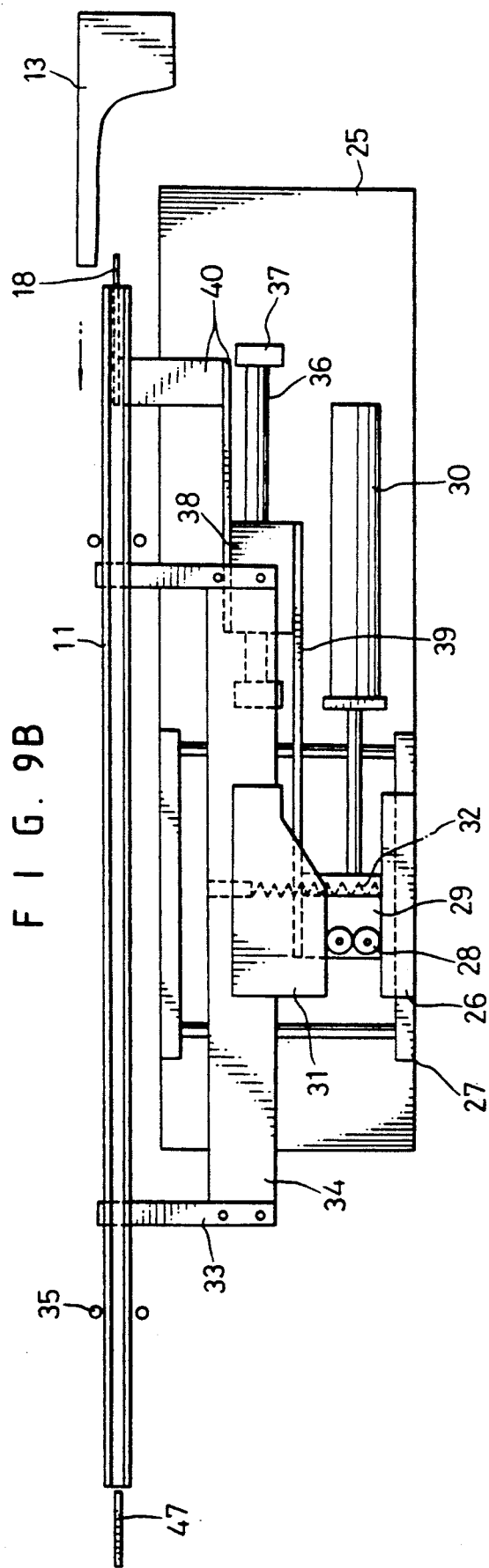
FIG. 9 A is a cross sectional view of the ejector section before it operates.

FIG. 8 is a perspective view, partly in cross section, of the ejector section, FIGS. 9A and 9B show the operation of the ejector section, and FIGS. 10 and 11 show an ejector located under the first transfer block. A guide post (27) having a guide plate (26) fixed thereto is mounted on a side portion of an upper surface of a stationary plate (25). A roller supporting table (29) having a pair of rollers (28) rotatably mounted on the top thereof is arranged at one side of the guide post (27). The table (29) may be reciprocally moved by actuation of a cylinder (30) in opposite directions as indicated by the arrow in FIG. 8. Further, a cam plate (31) having a sloping surface is mounted on the top of the roller supporting table (29) in confronting relation to the guide plate (26). A tension spring (32) is mounted on the underside of the cam plate (31) to constantly bias the sloping surface of the cam plate to one of the rollers (28). Therefore, when the roller supporting table (29) is reciprocated by means of the cylinder (30), upon signal from the microprocessor, the cam plate (31) is moved in a direction perpendicular to the moving direction of the table (29) by means of the rollers (28) arranged between the sloping surface of the cam place and the guide plate (26). Specifically, the sloping surface of the cam plate (31) is shaped in such a manner that the distance between the cam plate and the guide plate becomes narrower, when the rollers (28) arranged between the stationary guide plate (26) and the movable cam plate (31) are moved by the movement of the supporting table (29), the rollers widen the distance stated above, whereby the cam plate (31) may be moved away from the guide plate (26).

A connecting plate (34) having a pair of supporting bars (33) fixed thereto is secured to one side of the cam plate (31) and may be reciprocally moved between a pair of guide rails (35) so that the supporting bars (33) may receive the empty sleeve released from the first transfer block (13). The guide rails (35) are arranged at the dropping section. Another guide post (37) is secured to the other side of the stationary plate (25). A pair of guide rods (36) are fixed to the guide post (37) and pass through a sliding block (38). The sliding block (38) is linked to the roller supporting table (29) by means of a connecting plate (39), and therefore, may be moved along the guide rods (36) by the movement of the roller supporting table. The ejector (18), movable in the elongated aperture (13b) of the first transfer block (13), is linked to the sliding block (38) via connecting pieces (40). Therefore, when the transfer block (13) is moved to a position in which the leg (15) side portion of the swing arm (17) as shown in a dash-and dotted line in FIG. 6, and then maintained horizontally by the swing arm (17), the empty sleeve (11) is positioned between the guide rails (35) arranged at the dropping section, as shown in FIG. 8.

Thereafter, when the sliding block (38) which may slide on the guide rails (36) is moved from the position shown in FIG. 9A to the position shown in FIG. 9B by actuation of the cylinder (30) by a signal from the microprocessor, in order to separate the empty sleeve from the first transfer block (13), the ejector (18) located in the elongated aperture (13b) of the transfer block is moved along with the sliding block to push one end of the empty sleeve. As a result, the empty sleeve is removed from the gripping recess (13a) of the transfer block (13) and falls between the guide rails (35) in proper position with the help of the stopper (47). At the same time, the roller supporting table (29) linked to the sliding block (38) via the connecting plate (39) is also moved in the same direction as the moving direction of the sliding block. Therefore, the rollers (28) rotatably mounted on the top of the roller supporting table are moved under the guidance of the guide plate (26), thereby pushing the sloping surface of the cam plate (31). As a result, the cam plate is moved in a direction perpendicular to the roller supporting table (29), whereby the empty sleeve removed from the gripping recess (13a) of the transfer block (13) may be put on the supporting bars (33). Then, when upon a retraction of the rod of the cylinder (30) upon appropriate signal generated by a sensor or the microprocessor, the roller supporting table (29) restores in the reverse order to that mentioned above, the cam plate (31) returns to its initial position by means of the tension spring (32) mounted on the underside of the cam plate. As this time, the empty sleeve (11) held between the guide rails (35) cannot be moved along with the supporting bars (33) and drops into the subsequent dropping section by its own weight upon a removal of the supporting bars (33). Transfer block (13) is now free to return to its starting point by actuation of the stepping motor (69) to pick up a new sleeve (11) containing IC chips to start another cycle.

Figure 13:
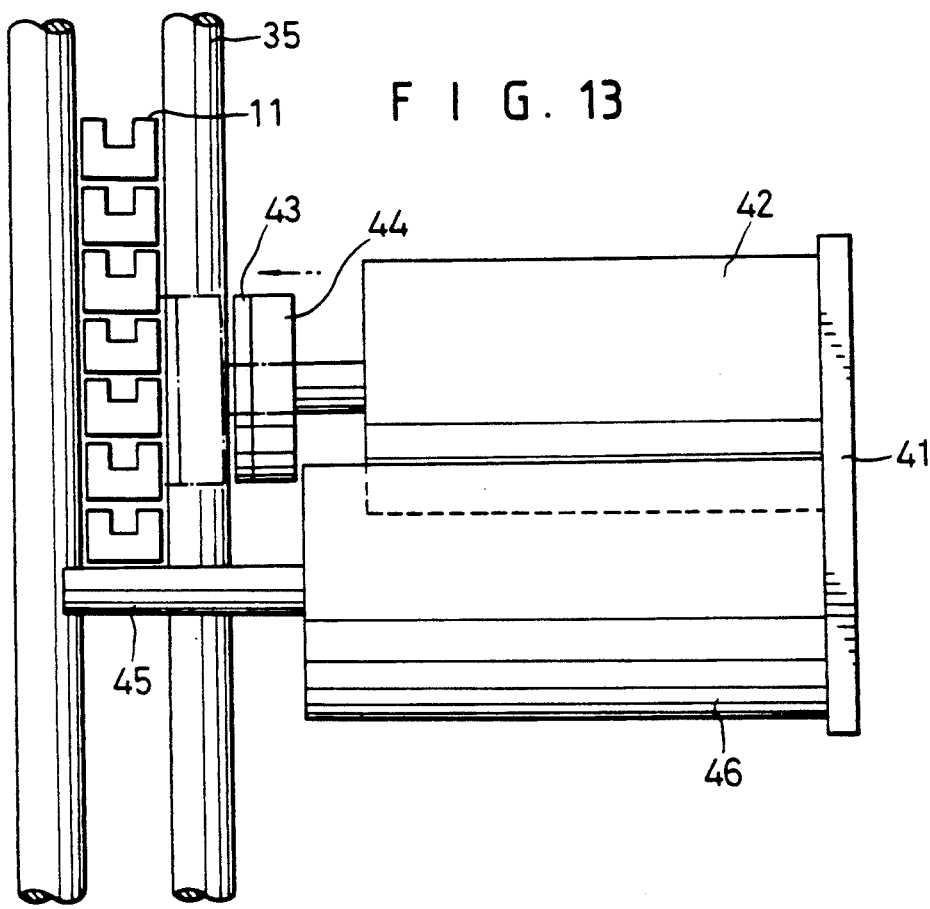
FIG. 13 is a side view of the dropping section shown in FIG. 12.
Figure 14:
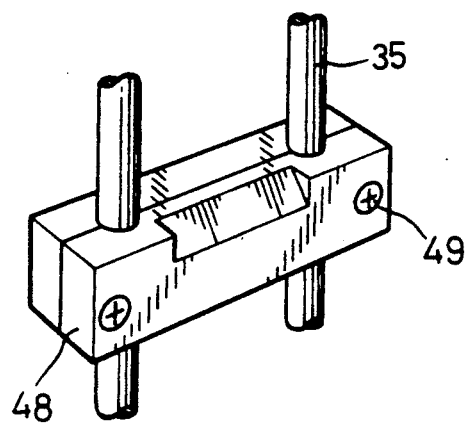
FIG. 14 is an enlarged perspective view of portion "E" in FIG. 2 showing an engaging member.

FIG. 12 is a plan view of the dropping section, FIG. 13 is a side view thereof, and FIG. 14 is a perspective view of an engaging member arranged at the lower portions of the guide rails of the dropping section. A pair of first cylinders (42) are mounted inside of a stationary plate (41) fixed to a sidewall of the frame (1). A pushing plate (44) having a silicon plate (43) fixed thereto is attached to a forward end of the first cylinder (42) advance and retreat by actuation of the cylinder (42). The silicon plate (43) on the pushing plate (44) prevents the sleeve (11) from being deformed by the pushing plate when the pushing plate supports the sleeve by actuation of the first cylinder (42). A pair of second cylinders (46) each having at its forward end an engaging rod (45) are mounted outside of the first cylinders (42). The engaging rod (45) may extend and retract by actuation of the second cylinder (46) by signal from a sensor or the microprocessor and support the lowest sleeve in its extended position. Further, a stopper (47) is mounted on the side of the frame (1) opposite the first transfer block (13), i.e., the side adjacent to one of the guide rails (35) which guide the sleeves when they are stacked on the dropping section while being held in constantly spaced relation to the stationary plate (41). An engaging member (48) having a sloping surface formed at a given position as shown in FIG. 14 is attached to the lower portions of the guide rails (35) by means of a screw (49), thereby permitting the lowest sleeve (11) stacked on the dropping section to be fed into the subsequent unloading section more easily.

As shown in FIG. 13, in the initial condition the sleeves fed from the preceding ejector section have been stacked between the guide rails (35), the first cylinder (42) remains retracted, while the second cylinder (46) remains extended to support the lowest sleeve by the engaging rod (45). Then, when the microprocessor determines based on the tested chips available to fill the sleeve or other criteria, that the lowest sleeve (11) is to be fed into the unloading section, to be filled with IC chips waiting to be discharged from the tester, the first cylinder (42) is extended by a signal from the microprocessor, so that the silicon plate (43) secured to the pushing plate (44) moderately grips the upper sleeves except for the lowest sleeve, as shown in a dash-and-dotted line in FIG. 13. Thereafter, the extended engaging rod (45) of the second cylinder (46) is retracted upon signal from the sensor or microprocessor to release the supported lowest sleeve (11), whereby the sleeve may freely fall into the subsequent process. At this time, the sleeve falls in a inclined state due to the sloping surface of the engaging member (48) as shown in FIG. 14.

Figure 16:
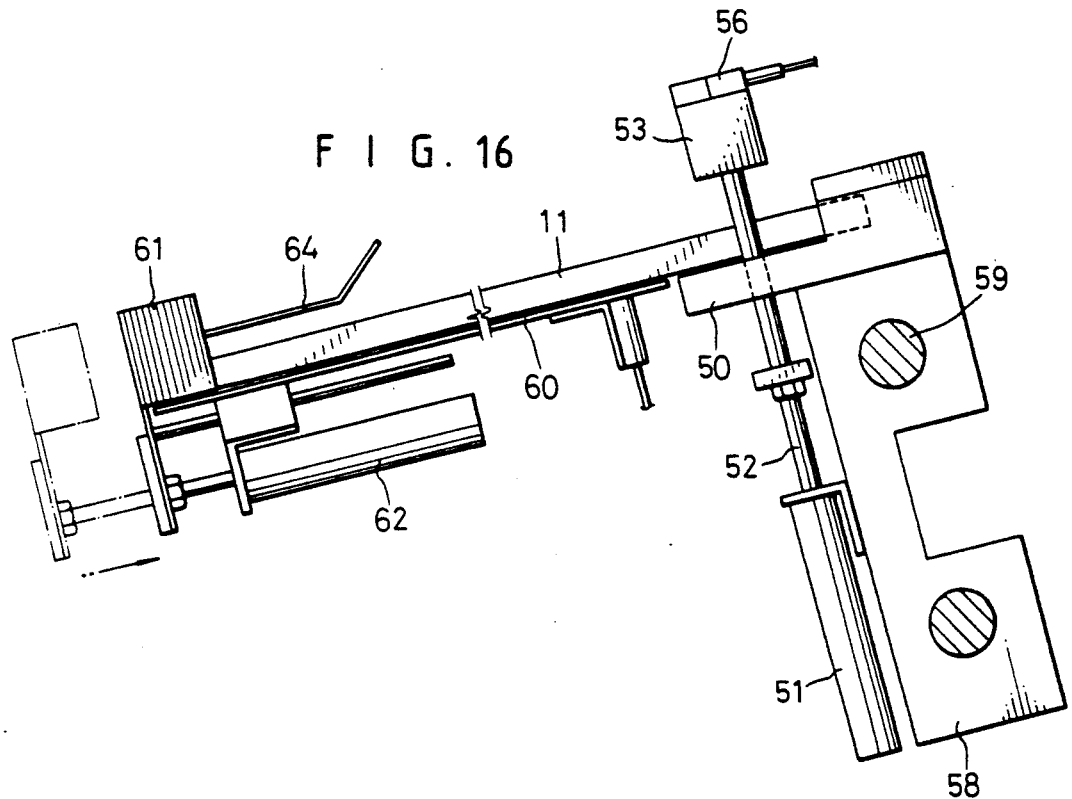
FIG. 16 is a side view of an unloading section with parts partially broken away.
Figure 17:
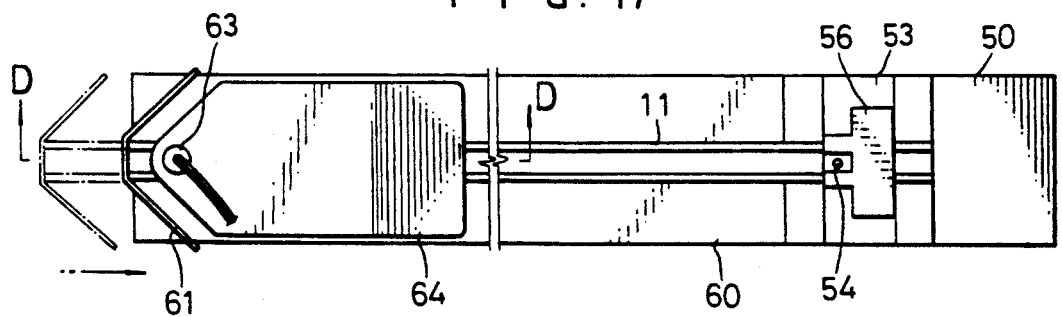
FIG. 17 is a plan view of the unloading section shown in FIG. 16.
Figure 18:
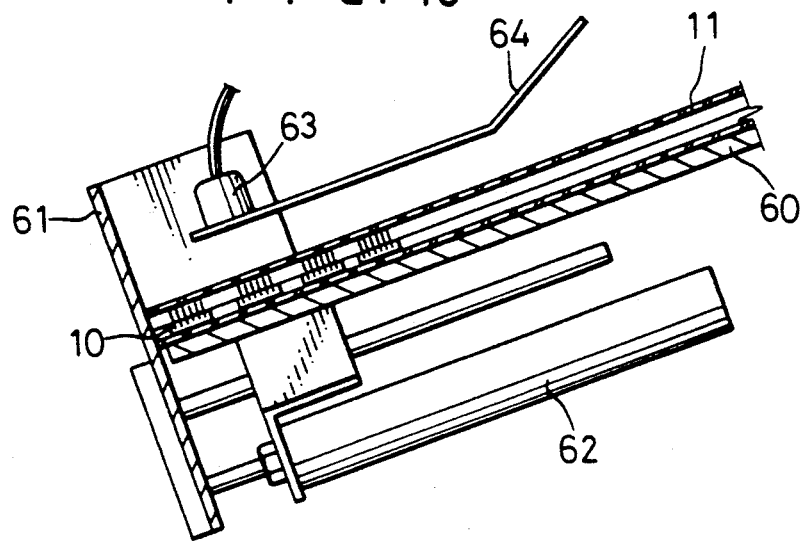
FIG. 18 is a cross sectional view taken on line D—D of FIG. 17.
Figure 19:
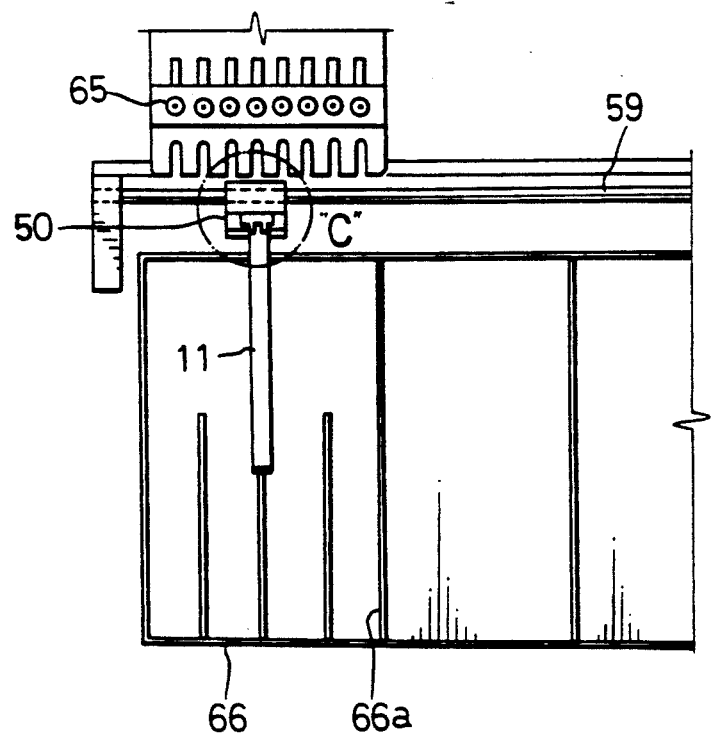
FIG. 19 is a view showing when the sleeve inserted into the second transfer block of the unloading section has been moved along a guide rod to a position for receiving IC chips sorted by the tester.

FIG. 15 is a perspective view, partly in cross section, of the unloading section, FIGS. 16 and 17 are a side view and a plan view of the unloading section with parts partially broken away, respectively; FIG. 18 is a cross sectional view taken on line D—D of FIG. 17; and FIG. 19 shows that the empty sleeve is moved by a second transfer block, by a timing belt and stepping motor, to the unloading section for receiving the IC chips sorted by the tester. A sleeve holder (53) connected to a cylinder (51) by means of a pair of guide bars (52) is mounted on the top of the second transfer block (50) having guide surfaces (50a) and gripping the sleeve (11). A sensor pin (54) which may contact the sleeve (11) is mounted in a hole of the sleeve holder (53) and normally biased downwardly by a spring (55) and is protruded downwardly through a recess (53a) formed at the underside of the sleeve holder (53). In addition, there is mounted on the top of the sleeve holder a sensor (56) for detecting an insertion of the sleeve (11) through the rising sensor pin (54) and an engaging block (57) having a V-shaped groove (57a) for guiding the sleeve falling in a inclined state by the engaging member (48) attached to the guide rails (35).

As shown in FIG. 16, a carriage (58) is secured to the underside of the second transfer block (50) and slidably engaged with a pair of transfer bars (59), whereby the second transfer block (50) may be reciprocated along the transfer bars, in the same manner as transfer block (13) was moved on bars (9), by a stepping motor (69) and timing belt (68) controlled by the microprocessor and by photoelectronics, similar to those shown in FIG. 6b. Further, an inclined plate (60) arranged at an angle of 30°-40° to a horizontal plane is mounted on one side of the second transfer block (50). A V-shaped pushing plate (61) connected to a cylinder (62) is also secured to the end of the inclined plate (60) opposite to the second transfer block (50). A stationary plate (64) having a sensor (63) fixed thereto is mounted closely to the inner surface of the pushing plate (61). The guide surfaces (50a) are formed at one side of the second transfer block (50) to guide precise insertion of the sleeve (11) into the second transfer block during the feeding of the sleeve to the transfer block by means of the pushing plate (61). The sensor (63) is mounted on the stationary plate (64) close to the pushing plate (61) to detect an IC chip (10) remaining in the sleeve without being fed to the tester (8) when the empty sleeve is sent to the unloading section. Further, with the inclined plate (60) arranged at an angle of 30°–40° to a horizontal plane, the IC chips can easily enter into the empty sleeve (11) due to the inclination when the empty sleeve is transported by the second transfer block (50) and then filled with the chips sorted by the tester (8).

The lowest empty sleeve freely dropping by means of the dropping section is placed on the inclined plate (60) under the guidance of the V-shaped groove (57a) of the engaging block (57) secured to the second transfer block (50), and at its one end is engaged with the pushing plate (61). At this point, the sleeve holder (53) is maintained in the elevated position in which the rod of the cylinder (51) connected thereto via the guide bars (52) is kept extended to separate the sleeve holder (53) from the upper surface of the second transfer block (50).

In the condition wherein the sleeve (11) rests on the inclined plate (60) and at its one end is engaged with the pushing plate (61), the IC chips (10) which likely remain in the sleeve without entering into the tester (8) by means of the sorter section are moved by their own weight to the lower end of the sleeve inclined by the inclined plate (60). Accordingly, when the sensor (63) fixed to the stationary plate (64) closely to the pushing plate (61) detects the IC chip, the sensor stops the actuation of the cylinder by a signal and gives notice to the operator of the remaining chip by means of a buzzer or any other signal.

When there is no IC chip in the sleeve, the cylinder (62) actuates by a signal from the microprocessor timer or a sensor detecting the sleeve presence and moves the pushing plate (61) in the arrow direction, as shown in a solid line in FIG. 16, thereby inserting the sleeve into the second transfer block (50) under the guidance of the guide surfaces (50a) formed in the second transfer block. At the time the sleeve has been inserted into the second transfer block (50), the sleeve holder (53) is lowered by means of the cylinder (51) activated by the microprocessor, to grip the sleeve and at the same time the sensor pin (54) mounted in the sleeve holder (53) to protrude downwardly moves toward the sleeve (11). In the case where the sleeve is situated with its groove facing upwards as shown in FIG. 15, the sensor pin (54) descending within the given limits is positioned in the groove of the sleeve, thereby failing to contact the sleeve and actuate the sensor (56), allowing the subsequent stage to be carried out. As shown in (a), (b) and (c) of FIG. 15, however, when the sleeve (11) is situated below the sensor pin (54) with the groove facing downwardly or laterally, the sensor pin contacts the upper surface of the sleeve, and then ascends against the biasing of the coil spring (55) to actuate the sensor (56) mounted on the top of the sleeve holder (53). When the sensor detects misplacement of the sleeve, it outputs a signal to shut down the unloading section and give the notice to the operator of such misplacement, for example, by means of the buzzer or the lamp connected to the sensor.

When the sleeve (11) is normally inserted into the second transfer block (50) and gripped by the sleeve holder (53), as shown in FIG. 19, the carriage (58) secured to the second transfer block (50) is moved along the transfer bars (59) by a stepping motor (69), connected to a timing belt, all controlled by the microprocessor and photoelectric or other sensors, (similar to the arrangement depicted in FIG. 6B) to the outlets of the tester (8) so that the sleeve may receive the IC chips (10) sorted by the tester. The second transfer block (50) being moved to the outlets of the tester is stopped at the outlet which is selected by sensing the number of sorted IC chips, i.e., it contains the number of tested IC chips that may be contained in one sleeve. Thereafter, a solenoid valve (65) provided above the outlet of the tester actuates upon a signal from the microprocessor to put the tested chips into the sleeve by means of air pressure generated by the tester (8). After the chips are fully contained in the sleeve, the second transfer block (50) is moved by the stepping motor (69) and timing belt (68), all controlled by the microprocessor, to storage box (66) located below the transfer bars (59), having partition walls (66a), forming bins, thereby permitting the IC chips to be classified and stored according to their characteristics. When the second transfer block, under control of the microprocessor, is stopped at the proper storage bin in the storage box, the sleeve holder (53) is elevated by actuation of the cylinder (51), by signal from the microprocessor, releasing the gripped sleeve, whereby the refilled sleeve may fall into the storage box (66) by its own weight and be stored therein. The transfer block is then returned to its starting point to begin a new cycle.

The foregoing description is one cycle of the operation comprising the steps of: automatically feeding the IC chips (10) in the sleeve (11) put randomly into the containing box (2) to the tester (8) through the loader and sorter sections; sending the empty sleeve to the unloading section through the ejector and dropping sections; refilling the empty sleeve with the IC chips sorted by the tester; and sorting the refilled sleeve in the storage box.

While the invention has been particularly shown and described with reference to the preferred embodiment thereof, it will be understood by those skilled in the art that various changes and modifications in form and details may be made therein without departing from the spirit and scope of the invention.

What is claimed is:

1. An apparatus for automatically unloading IC chips out of sleeves, comprising:
   a loader section with means for picking up randomly arranged loaded sleeves said means comprising a timing belt having sleeve holders and an alignment plate which cooperates with the sleeve holders to cause improperly oriented sleeves to return to the hopper;
   a sorter section for receiving said sleeves containing IC chips comprising means for further positioning the loaded sleeves and outputting emptied IC chip sleeves; and
   an ejection section with means for ejecting the chips from the sleeves.

2. An apparatus for loading and unloading sleeves for an IC tester, comprising:
   a loader section including a timing belt provided between a containing box and a bracket, said containing box nd said bracket being fixed to a frame of said loader section, sleeve holders equidistantly mounted on said timing belt for supporting and conveying the sleeves, and first and second aligning plates secured to a fixed plate, which properly orients and outputs the sleeves;
   a sorter section including a first transfer block having integral legs formed with hooking grooves, the transfer block also having a gripping recess for gripping the sleeve, transfer bars for guiding a reciprocation of said first transfer block, a carriage movable along said transfer bars, a solenoid valve secured to said first transfer block, a swing arm means and spring means for elevating and lowering said first transfer block, and a pushing plate for inserting the sleeve into said gripping recess, which sorter section receives the sleeves from the loader section and conveys them to the appropriate inlet of an IC chip tester, where they re inserted into the tester;

an injector section including a roller supporting table having a pair of rollers and mounted on a stationary plate, a cam plate movable by said rollers, supporting bard connected to said cam plate by means of a connecting pole, a sliding block connected to said roller supporting table by means of a connecting plate, and an ejector linked to said sliding block ia connecting pieces, which ejector section removes the transfer block for delivery from the sorter section;

a dropping section for receiving said transfer block and comprising a pair of guide rails, a pair of first cylinders mounted on a stationary plate, each having a silicon plate and a pushing plate, and another pair of second cylinders outside of said first cylinders, each having an engaging rod, which dropping section provides a means for collecting the empty sleeves in a stack to be released one at a time when needed by the microprocessor;

an unloading section including a second transfer block for gripping and transporting an empty sleeve, a sleeve holder connecting to guide bars passing through said second transfer block, a sensor pin disposed in said sleeve holder and normally biased downwardly by a spring, a sensor for detecting an insertion of the sleeve through said sensor pin, and a pushing plate for inserting the sleeve into said second transfer block; a solenoid connected to guide bars and to the sleeve holder to secure the sleeve upon insertion by the pushing plate and release the sleeve into a predetermined bin after arrival by traveling along guide rails, which unloading section receives eh empty sleeves from the dropping section and transports them to a selected tester outlet, where they are refilled with tested chips from the IC chip tester, then conveyed to the appropriate bin of the storage box and released into the bin to be stored as properly tested and classified chips; and controlling means for sensing and controlling the movement of the parts;

whereby when the sleeves filled with the IC chips and put into said containing box, the sleeves are sent to said sorter section through said loader section, thereby feeding the IC chips to said tester, and the empty sleeves which arrived at a given position of si sorter section are transferred to said dropping section by means of said ejector section, so that the chips may then be sorted by said tester, may receive the tested IC chips and thereafter be classified and stored in a storage box at said unloading section.

3. An apparatus, as claimed in claim 2, wherein said sleeve holders and said sleeves are sized and said timing belt is angled to assure based on the center of gravity of the sleeves that the sleeves are properly pre-positioned for feeding to the sorter section.

4. An apparatus as claimed in claim 2, wherein the height of each said sleeve holders on said timing belt of said loader section is greater than the height of the said first ad second aligning plates and said timing belt is positioned at such an angle to the vertical (preferably 10 degrees), wherein the angle of the timing belt with the vertical si such that when the sleeve is not supported by said sleeve holder in a given orientation, it will fall into said containing box by its own weight.

5. An apparatus as claimed in claim 2, wherein said pushing plate is opposite to said first transfer block and is generally V-shaped in cross section for inserting the sleeve fee by means of said timing belt into said gripping recess of said first transfer block.

6. An apparatus as claimed in claim 2, wherein said solenoid valve mounted on the top of said first transfer block of said sorter section has at its lower end a control pin, said control pin being extended into and retracted from said gripping recess to control the feeding of the IC chips in the sleeve to said tester.

7. An apparatus as claimed in claim 5, wherein said sorter section further comprises a vibrator mounted on one side of a cover plate, said vibrator being operated after the lapse of given time from a retraction of said control pin of said solenoid valve.

8. An apparatus as claimed in claim 2, wherein said wing arm is selectively inserted into said hooking grooves of said legs secured to the lower portion of said first transfer block to elevate or lower said first transfer block.

9. An apparatus as claimed in claim 2, wherein said sorter section further comprises a spring disposed between said first transfer block and said carriage, whereby said first transfer block will normally be maintained in an elevated position.

10. An apparatus as claimed in claim 2, wherein said guide rails of said dropping section comprise rods each formed into a spear shape.

11. An apparatus as claimed in claim 2, wherein said dropping section further comprises an engaging member having a sloping surface and attached to the lower portions of said guide rails, and said unloading section further comprises an engaging block disposed above said sensor and having at its forward end a V-shaped groove inclined formed to permit the sleeve falling by its own weight to slide to said unloading section.

12. An apparatus, as claimed in claim 2, providing means by which a non-tested IC chip remaining in a sleeve to be refilled may be detected.

13. An apparatus as claiemd in claim 2, wherein said unloading section further includes means which comprise an inclined plate, a stationary plate located parallel to said inclined plate and close to said pushing plate, and a sensor fixed to said stationary plate for detecting the presence of an IC chip in the empty sleeve.

14. An apparatus for automatically loading and unloading IC chips into and ut of sleeves, each sleeve having at least one end cap, for an IC tester with at least one deposit slot and storing at the sleeves loaded with IC chips after testing according to the tested characteristics of the IC chips, comprising:

a loader section with means for picking up randomly arranged loaded sleeves, each of said sleeves having at least one of said end caps removed, said means comprising a timing belt having sleeve holders and an alignment plate which cooperates with the sleeve holders to cause improperly oriented sleeves to return to the hopper;

a sorter section for receiving said sleeves containing IC chips comprising means for further positioning the loaded sleeves at one of said deposit slots in said tester for the IC chips and outputting emptied IC chip sleeves, said sorter section further comprising vibrator means for actuation a predetermined time after said positioning occurs;

an ejection section with means for insertion of the chips from the sleeves into the tester;

a dropping section with means for receiving and placing the emptied IC hip sleeves in position to be refilled after testing of the IC chips; and an unloading section with means for refilling the IC chip sleeves from a tester outlet selected from several tester outlets and for depositing the loaded sleeves in a predetermined bin according of the characteristics of the chips.

15. An apparatus for automatically picking up and orientating sleeves containing IC chips, comprising:
   a hopper for holding randomly arranged loaded sleeves;
   a timing belt having sleeve holders for picking up the randomly arranged load sleeves from the hopper; and
   an angled alignment plate which cooperates with the sleeve holders to cause improperly oriented sleeves to return to the hopper.

16. An apparatus as claiemd in claim 15, comprising two angles alignment plates arranged successively along the timing belt.

17. An apparatus as claimed in claim 15, wherein the timing belt is arranged at an angle of approximately 10° from vertical.

* * * * *